(12) United States Patent
Dotta et al.

(10) Patent No.: US 6,847,121 B2
(45) Date of Patent: Jan. 25, 2005

(54) SEMICONDUCTOR DEVICE AND PACKAGE PRODUCT OF THE SEMICONDUCTOR DEVICE

(75) Inventors: Yoshihisa Dotta, Nara (JP); Kazuo Tamaki, Kyoto (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/223,658

(22) Filed: Aug. 20, 2002

(65) Prior Publication Data

US 2003/0124769 A1 Jul. 3, 2003

(30) Foreign Application Priority Data

Dec. 28, 2001 (JP) ........................................ 2001-400715

(51) Int. Cl.⁷ .............................................. H01L 23/48
(52) U.S. Cl. ...................... 257/778; 257/787; 438/108; 438/125; 438/126; 438/127
(58) Field of Search ................................ 257/778, 787; 438/108, 125, 126, 127

(56) References Cited

U.S. PATENT DOCUMENTS 6,027,958 A    2/2000  Vu et al. .................... 438/110

FOREIGN PATENT DOCUMENTS

JP          6-64379 A       3/1994
JP       2000-11129 A       1/2000

*Primary Examiner*—Richard Elms
*Assistant Examiner*—Christian D. Wilson
(74) *Attorney, Agent, or Firm*—Birch, Stewart, Kolasch & Birch, LLP.

(57) ABSTRACT

A semiconductor device includes, a circuit constituting section having a function circuit and an externally-drawing electrode, connected to the function circuit, on a surface of the circuit constituting section. An insulating layer is provided on a side of a rear surface of the circuit constituting section. The insulating layer has a face opposite to the circuit constituting section, which has an area that is larger than an area of the rear surface of the circuit constituting section.

8 Claims, 7 Drawing Sheets

SEMICONDUCTOR DEVICE AND PACKAGE PRODUCT OF THE SEMICONDUCTOR DEVICE

FIELD OF THE INVENTION

The present invention relates to a semiconductor device, particularly to (a) a semiconductor device suitable to manufacture a thin semiconductor package, (b) a packaging method thereof, and (c) a package product thereof.

BACKGROUND OF THE INVENTION

Recently, with miniaturization of electric devices, circuit substrates have been made thin. In order to package parts in a complicated and narrow space inside a small electric device (small portable device) in a high-density manner, flexible printed circuits (FPC) which can be bent have been used. Further, a technique, in which a circuit pattern is formed on a box body itself so as to realize a small body and a light weight, is proposed.

Under such condition, in a case where a typical semiconductor package, for example, a semiconductor package of a resin-sealing type represented by QFP (Quad Flat Package), BGA (Ball Grid Allay), and CSP (Chip Scale Package) is used in a small portable device in particular, there occurs the following problems.

That is, even though a thin substrate or a flexible printed substrate can be bent (transformed) so that its shape is complicated in the small portable device, it is impossible to bend a typical semiconductor package due to its hardness. This means that: a semiconductor device which cannot be transformed is provided on a flexible printed substrate which can be bent freely, so that it becomes difficult to mount the substrate in a space having a complicated shape inside the small portable device.

It is also difficult to mount a hard semiconductor package on a circuit formed on a curved surface of a box body.

In order to solve the problems, Japanese Unexamined Patent Publication No. 64379/1994 (Tokukaihei 6-64379) (Publication date: Mar. 8, 1994) and Japanese Unexamined Patent Publication No. 11129/2000 (Tokukai 2000-11129) (Publication date: Jan. 14, 2000), for example, recite such a technique that: a semiconductor device (hereinbelow referred to as semiconductor chip) is made thin so as to be flexible, thus bringing about no problem in bending.

Typically, flip chip bonding is performed upon electrically connecting a semiconductor chip to a circuit substrate so as to make a thickness of whole the semiconductor chip thin. This is based on the following reason. In a case where wire bonding is performed upon electrically connecting the semiconductor device to the circuit substrate, it is necessary to coat a wire with an epoxy resin etc. for protection, which causes the semiconductor package to be thick, so that it becomes difficult to bend the semiconductor package.

In a case where the semiconductor chip and the circuit substrate are connected to each other in accordance with the flip chip bonding for example, a protruding electrode formed on an externally-drawing electrode of the semiconductor chip is positioned corresponding to an electrode on the circuit substrate, and is pressed so that the protruding electrode and the electrode on the circuit substrate are in contact with each other, and an adhesive resin is cured. This enables the semiconductor chip to be packaged on the circuit substrate in accordance with the flip chip bonding, so that a thin semiconductor package is formed.

Note that, as to the foregoing publications, Japanese Unexamined Patent Publication No. 11129/2000 (Tokukai 2000-11129)(Publication date: Jan. 14, 2000) discloses an example in which a semiconductor chip is packaged on a circuit substrate via an anisotropic conductive sheet in accordance with the flip chip bonding.

Since a semiconductor package manufactured in this manner has an extremely thin semiconductor chip compared with a typical semiconductor package, it is possible to make the semiconductor package itself thin, so that the semiconductor package can be curved. Thus, it is possible to provide the semiconductor package on a curved surface of a narrow space in a box body etc.

Further, when a thickness of the semiconductor chip is set to be not more than 100 μm so as to make the semiconductor package thin, the semiconductor chip tends to be damaged. Thus, it is difficult to treat the semiconductor chip in transporting the semiconductor chip or in packaging the semiconductor chip in the circuit substrate, so that there occurs such a problem that the productivity is led to worse.

Then, the following technique is proposed: a thick reinforcing member is temporarily formed on a side of a rear surface of the semiconductor chip so as to perform the flip chip bonding, and the reinforcing member is removed after performing the flip chip bonding, so that it becomes easier to treat the semiconductor chip which tends to be damaged in making the semiconductor chip thin.

Incidentally, in a case where the semiconductor chip and the circuit substrate are connected to each other in accordance with the flip chip bonding, it is typically required to use a thermally curable adhesive, represented by ACF (anisotropic conductive adhesive film) and ACP (anisotropic conductive adhesive paste), which softens or flows at least upon performing the flip chip bonding.

However, in a case where the foregoing thin semiconductor chip is connected to the circuit substrate in accordance with the flip chip bonding using the foregoing adhesive, there occur the following problems.

Figure 7:
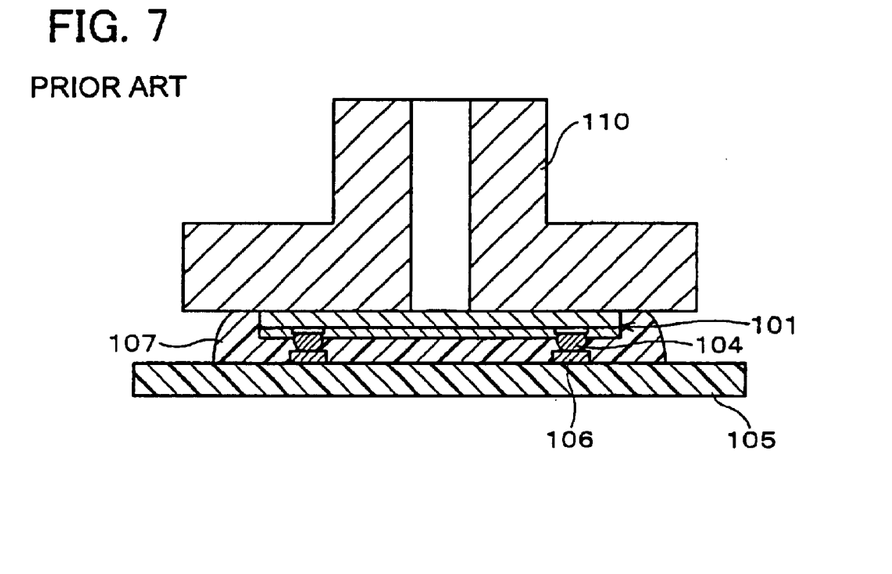
FIG. 7 is a schematic sectional view showing a typical packaging process in which a semiconductor device is packaged on a circuit substrate.

In typical flip chip bonding, as shown in FIG. 7, a semiconductor chip 101 is temporarily subjected to a pressure via a thermally curable adhesive 107 such as ACF on a circuit substrate 105 so that electrodes of the semiconductor chip 101 and electrodes of the circuit substrate 105 are electrically connected to each other. Under this condition, a bonding collet 110 presses the semiconductor chip 101 against the circuit substrate 105.

Thus, when the bonding collet adds a pressure, that is, when the bonding is performed, the heated adhesive 107 softens or flows due to the heat so as to overflows from a space between the semiconductor chip 101 and the circuit substrate 105, so that the heated adhesive 107 is inclined to surround a side face of the semiconductor chip 101.

Thus, as shown in FIG. 7, in a case where the boding collet presses the semiconductor chip 101 directly, there is a possibility that the overflowing adhesive 107 adheres to the bonding collet 110.

Figure 8:
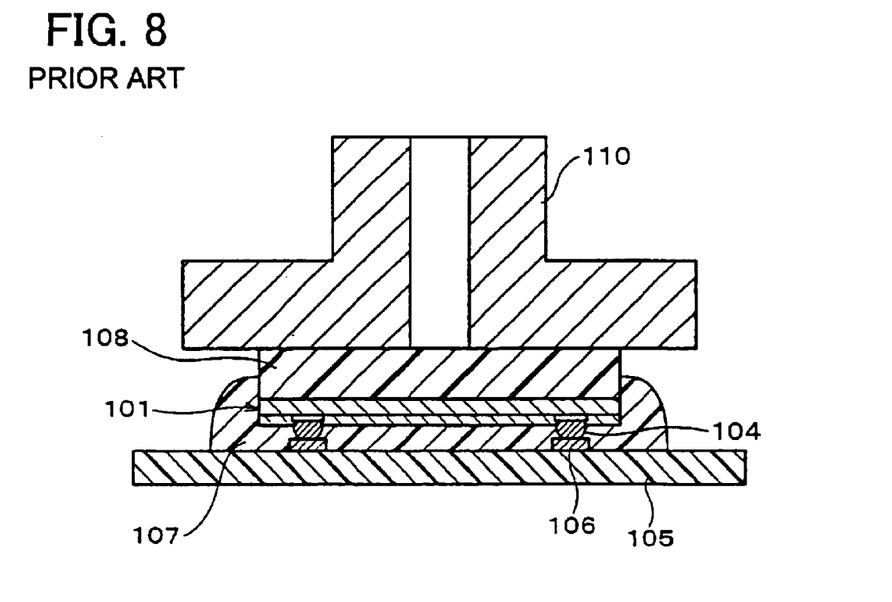
FIG. 8 is a schematic sectional view showing another example of a typical packaging process in which a semiconductor device is packaged on a circuit substrate.

Further, as shown in FIG. 8, in a case where there is provided a reinforcing member 108 on the semiconductor chip 101, the adhesive 107 does not adhere to the bonding collet 110 depending on a thickness of the reinforcing member 108, but there is a possibility that the adhesive 107 adheres to the reinforcing member 107.

That is, as shown in FIG. 7, in the case where the adhesive 107 reaches the bonding collet 110, the bonding collet 110 is stuck on the semiconductor chip 101, so that it is difficult to perform the flip chip bonding successively without any problem.

Further, as shown in FIG. 8, in the case where the adhesive 107 reaches the reinforcing member 108, it is difficult to remove the reinforcing member 108 after packaging the semiconductor chip 101 on the circuit substrate 105.

Thus, in a case of using an adhesive which softens or flows upon performing the flip chip bonding so as to connect the semiconductor chip to the circuit substrate, there occurs such a problem that the productivity of the semiconductor package is led to worse.

Further, as shown in FIG. 8, the method in which the reinforcing member is formed on the semiconductor chip requires (a) a step of adding the reinforcing member to the semiconductor chip and (b) a step of removing the reinforcing member from the semiconductor chip packaged on the circuit substrate, so that the number of steps required in manufacturing the semiconductor package is increased. This also brings about such a problem that the productivity of the semiconductor package is led to worse.

SUMMARY OF THE INVENTION

The present invention is made so as to solve the foregoing problems. The object of the present invention is to provide (a) a semiconductor device which does not lead the productivity of a semiconductor package to worse in a case of using an adhesive which softens or flows upon performing flip chip bonding with respect to a semiconductor chip and a circuit substrate, and (b) a packaging method of the semiconductor device.

In order to solve the foregoing problems, a semiconductor device of the present invention includes: a circuit constituting section having (a) a function circuit and (b) an externally-drawing electrode, connected to the function circuit, on a surface of the circuit constituting section; and an insulating layer provided on a side of a rear surface of the circuit constituting section, wherein the insulating layer has a face opposite to the circuit constituting section, and an area of the face is set so as to be larger than an area of the rear surface of the circuit constituting section.

Typically, in a case of using an adhesive, represented by ACF (anisotropic conductive film) and ACP (anisotropic conductive paste), which softens or flows at least upon performing the flip chip bonding, so as to perform the flip chip bonding with respect to the semiconductor device and a circuit substrate, there is a possibility that: the adhesive provided on the circuit substrate flows upon performing the flip chip bonding so as to be let out to the outside of the semiconductor device, and the overflowing adhesive surrounds a side face of the circuit constituting section so as to reach a rear surface of the circuit constituting section. As a thickness of the circuit constituting section becomes thinner, the overflowing adhesive is more likely to reach the rear surface of the semiconductor device.

Then, like the foregoing arrangement, the insulating layer is formed on the side of the rear surface of the circuit constituting section. In the insulating layer, an area of the face opposite to the circuit constituting section is set to be larger than an area of the circuit constituting section, so that the adhesive that has overflowed from a space between the semiconductor device and the circuit substrate upon performing the flip chip bonding is dammed by the insulating layer even though the adhesive surrounds the side face of the circuit constituting section.

Thus, since the overflowing adhesive does not adhere to the bonding collet for pressing the semiconductor device via the insulating layer when the flip chip bonding is performed, it is possible to reduce occurrence of such problem that the semiconductor device adheres to the bonding collet due to the overflowing adhesive, so that it is possible to continue the flip chip bonding without any problem.

Thus, it is possible to improve the productivity of the semiconductor package as a package product obtained by packaging the semiconductor device on the circuit substrate.

For a fuller understanding of the nature and advantages of the invention, reference should be made to the ensuing detailed description taken in conjunction with the accompanying drawings.

BRIEF DESCRIPTION OF THE DRAWINGS

FIG. 4(a) is a schematic sectional view showing a packaging process in which the semiconductor device manufactured in accordance with the manufacturing processes shown in FIG. 3(a) and FIG. 3(b) is packaged on the circuit substrate.

FIG. 4(b) is a schematic sectional view showing a packaging process in which the semiconductor device manufactured in accordance with the manufacturing processes shown in FIG. 3(a) and FIG. 3(b) is packaged on the circuit substrate.

FIG. 4(c) is a schematic sectional view showing a packaging process in which the semiconductor device manufactured in accordance with the manufacturing processes shown in FIG. 3(a) and FIG. 3(b) is packaged on the circuit substrate.

DESCRIPTION OF THE EMBODIMENTS

[Embodiment 1]

One embodiment of the present invention is described as follows.

Figure 1:
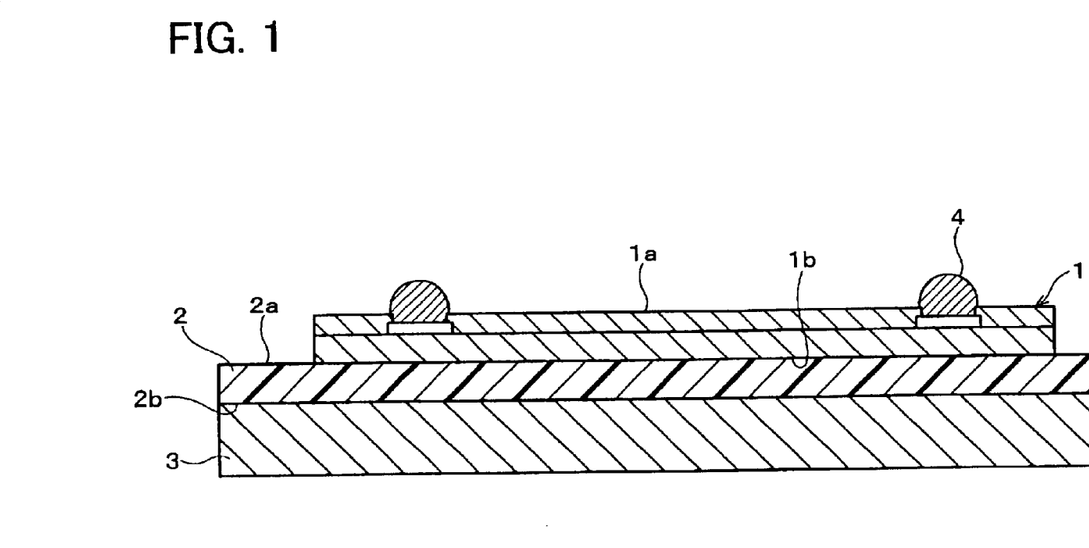
FIG. 1 is a schematic sectional view of a semiconductor device of the present invention.

A semiconductor device according to the present embodiment is arranged so that: as shown in FIG. 1, on a surface 1a, there are provided a function circuit and a protruding electrode 4 which is an externally-drawing electrode connected to the function circuit, and a circuit constituting section 1 having the surface 1a also has a rear surface 1b, and the rear surface 1b is in contact with an insulating layer 2.

There is formed an Si substrate (silicon substrate) 3, whose surface is as large as that of the insulating layer 2, on a face (rear surface 2b) which is the back with respect to a face (surface 2a) opposite to the circuit constituting section 1 of the insulating layer 2. Note that, the Si substrate 3 is removed after the semiconductor device is packaged on a circuit substrate 5 described later.

An area of the surface 2a of the insulating layer 2 is set to be larger than an area of the rear surface 1b of the circuit constituting section 1.

Figure 2:
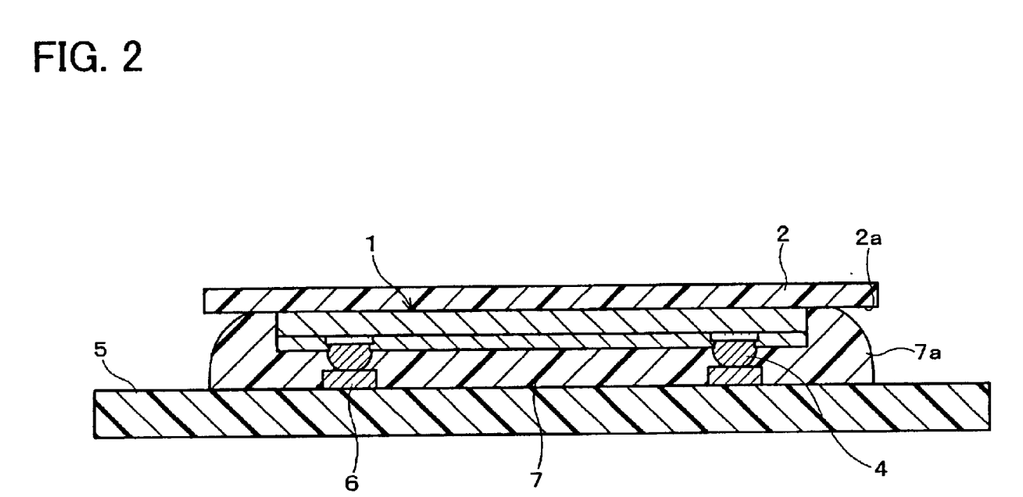
FIG. 2 is a schematic sectional view of a semiconductor package in which the semiconductor device shown in FIG. 1 is packaged on a circuit substrate.

Here, the area of the surface 2a of the insulating layer 2 is described as follows referring to FIG. 2. FIG. 2 shows how the semiconductor device of the foregoing arrangement is packaged on the circuit substrate 5, that is, FIG. 2 is a schematic sectional view of a package product (semiconductor package).

As shown in FIG. 2, in the case where the semiconductor device is packaged on the circuit substrate, the semiconductor device and the circuit substrate 5 are provided so as to be opposite to each other so that the protruding electrode 4 provided on the surface 1a of the circuit constituting section 1 is electrically connected to an electrode 6 provided on a surface 5a of the circuit substrate 5. The semiconductor device and the circuit substrate 5 are connected to each other with the adhesive 7, such as ACF (Anisotropic Conductive Film), made of thermally curable resin.

In connecting the semiconductor device and the circuit substrate 5 to each other, the flip chip bonding is performed, and a pressure and heat are added upon connection. Thus, the adhesive 7 softens and flows so as to overflows outward from a connection portion between the circuit constituting section 1 of the semiconductor device and the circuit substrate 5. At this time, it is necessary to dam an overflowing portion 7a of the adhesive 7 that has overflowed from the connection portion so that the overflowing portion 7a does not flow beyond the rear surface 1b of the circuit constituting section 1 and does not reach the rear surface of the semiconductor device.

Thus, it is preferable that at least an area of the surface 2a of the insulating layer 2, as shown in FIG. 2, is set to be so large as to be able to dam the adhesive 7, that has overflowed from the connection portion upon performing the flip chip bonding, in a case where the adhesive 7 reaches the surface 2a of the insulating layer 2.

In the present embodiment, description is given on a semiconductor device arranged so that: as shown in FIG. 1, there is formed the Si substrate 3 on the rear surface 2b of the insulating layer 2, and there is formed the circuit constituting section 1 on the surface 2a of the insulating layer 2. That is, description is given on an SOI-type semiconductor device arranged so that there is formed the circuit constituting section 1 on an SOI (Silicon on Insulator) wafer.

Further, since there is formed the protruding electrode 4, which protrudes outward, on the surface 1a of the circuit constituting section 1, it is possible to readily connect the circuit substrate 5 (flexible substrate) to the electrode 6 without fail.

A manufacturing process of the SOI-type semiconductor device is described as follows referring to FIGS. 3(a) and 3(b), and FIGS. 4(a) to 4(c).

Figure 3:
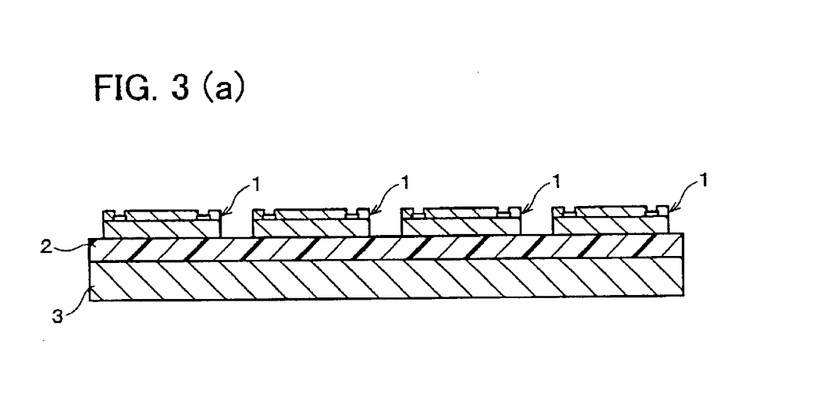
FIG. 3(a) is a schematic sectional view showing a manufacturing process of the semiconductor device shown in FIG. 1.
FIG. 3(b) is a schematic sectional view showing a manufacturing process of the semiconductor device shown in FIG. 1.

First, as shown in FIG. 3(a), on the insulating layer 2 formed on the Si substrate, there are provided a plurality of circuit constituting sections 1 having function circuits.

As to a thickness of the circuit constituting section 1, approximately 0.5 µm to 100 µm thickness is required to arrange circuits as a semiconductor device. It is preferable to set the thickness to be not more than 10 µm so as to secure the strength with respect to curving of the semiconductor device. Note that, in the present embodiment, the thickness is set to be 3 µm.

In forming the insulating layer 2, it is possible to use an oxide film such as $SiO_2$ or a nitride film such as SiN. Note that, in the present embodiment, an $SiO_2$ film having a 0.1 µm thickness is used as the insulating layer 2. The insulating layer 2 functions as a stopper in removing the Si substrate 3 in accordance with etching in a latter process.

When a total thickness of the circuit constituting section 1 and the insulating layer 2 is not more than 100 µm, the strength is not sufficient and it is difficult to treat the semiconductor device, so that the thickness of the Si substrate 3 is set to be 400 µm.

The circuit substrate 5 is a flexible substrate, made of polyimide resin, which has a 10 to 25 µm thickness.

Next, as shown in FIG. 3(b), the protruding electrode 4 having an approximately 3 to 5 µm height is formed on an active surface of the semiconductor device, that is, on the externally-drawing electrode formed on the function circuit of the surface 1a of the circuit constituting section 1.

The protruding electrode 4 is provided by forming nickel and gold successively in accordance with electrolytic plating or electroless plating.

The semiconductor device manufactured in this manner is cut so as to be divided into individual semiconductor devices in accordance with a predetermined dicing position.

Next, description is given on a manufacturing process of a semiconductor package in which the semiconductor device is packaged on the circuit substrate 5.

Figure 4:
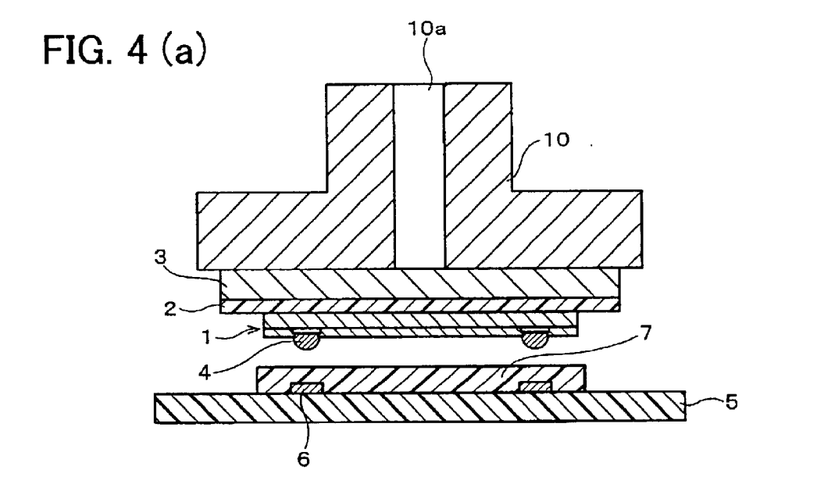

First, as shown in FIG. 4(a), an anisotropic-conductive-film adhesive 7 is provided on the circuit substrate 5.

While, on the side of the Si substrate, the semiconductor device is subjected to vacuum absorption by the bonding collet 10, and the protruding electrode 4 formed on the circuit constituting section 1 of the semiconductor device are positioned so as to correspond to the electrode 6 on the circuit substrate 5. The bonding collet 10 performs the vacuum absorption with respect to the semiconductor device by means of a vacuum absorption hole 10a formed in a central portion of the bonding collet 10.

Next, as shown in FIG. 4(b), the bonding collet 10 adds a pressure so that the semiconductor device and the circuit substrate 5 are in contact with each other, and heats them.

At this time, the adhesive 7 provided on a lower portion of the semiconductor device softens and flows, and a part of the adhesive 7 is let out, so that an overflowing portion 7a of the adhesive 7 reaches the surface 2a of the insulating layer 2 of the semiconductor device.

However, as described above, at least an area of the surface 2a of the insulating layer 2, as shown in FIG. 2, is set to be so large as to be able to dam the overflowing adhesive 7 upon performing the flip chip bonding, in a case where the adhesive 7 reaches the surface 2a of the insulating layer 2. Thus, it is possible to prevent the adhesive 7 from adhering to the Si substrate 3 and the bonding collet 10, so that the flip chip packaging is completed without any problem.

Next, the Si substrate 3 is removed in accordance with etching. Thus, as shown in FIG. 4(c), the semiconductor package has such a shape that the circuit constituting section 1 and the insulating layer 2 are packaged on the circuit substrate 5 in accordance with the flip chip package, so that it is possible to realize a flexible semiconductor package which can be bent in use. Note that, in a case where it is not necessary to bend the semiconductor package and a thickness of the Si substrate 3 brings about no problem, it is not necessary to remove the Si substrate 3.

It is possible to perform the etching with respect to the Si substrate 3 by using solution in which fluorine and nitric acid are mixed for example.

In the present embodiment, a thickness of the circuit constituting section 1 of the semiconductor device is thin such as not more than 10 $\mu$m, which brings about the strength with respect to bending, so that the flexibility is realized. Thus, it is possible to provide a semiconductor package which is so thin that the semiconductor package can be bent. Further, the insulating layer 2 may be removed with hydrofluoric acid.

[Embodiment 2]

Another embodiment of the present invention is described as follows. Note that, the same reference signs are given to members having the same functions as the members of the foregoing embodiment, and description thereof is omitted.

A semiconductor device according to the present embodiment is manufactured as in the embodiment 1. However, the semiconductor device according to the present embodiment is different from the semiconductor device of the embodiment 1 in that, as shown in FIG. 5(a), a gold wire bump 14 is provided on the circuit constituting section 1 instead of the protruding electrode 4, and in that ACP (Anisotropic Conductive Paste) adhesive 8 is used instead of the adhesive 7 made of ACF.

The gold wire bump 14 is provided on the circuit constituting section 1 by using a wire bonding technique, and its height is set to be 50 to 60 $\mu$m.

Figure 5:
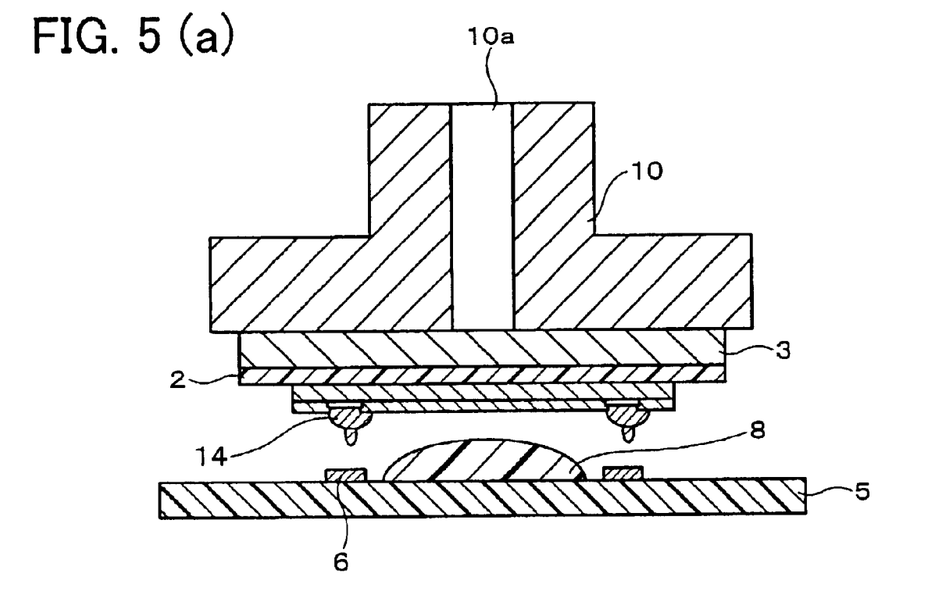
FIG. 5(a) is a schematic sectional view showing a packaging process in which a semiconductor device according to another embodiment of the present invention is packaged on the circuit substrate.
FIG. 5(b) is a schematic sectional view showing a packaging process in which the semiconductor device according to another embodiment of the present invention is packaged on the circuit substrate.

Here, referring to FIGS. 5(a) and 5(b), description is given on a manufacturing process of a semiconductor package in which the semiconductor device arranged in the foregoing manner is packaged on the circuit substrate 5.

First, as shown in FIG. 5(a), by using a dispenser, the adhesive 8 is provided on a predetermined position on the circuit substrate 5, that is, a position in the vicinity of a central portion of the connection portion between the circuit constituting section 1 and the circuit substrate 5.

While, the semiconductor device is subjected to absorption by the bonding collet 10, and the gold wire bump 14 of the semiconductor device is placed so as to correspond to the electrode 6 of the circuit substrate 5.

Further, when the bonding collet 10 adds a pressure so that the semiconductor device and the circuit substrate 5 are in contact with each other, the adhesive 8 spreads between the semiconductor device and the circuit substrate 5, and a part of the adhesive 8 is let out, so that an overflowing portion 8a of the adhesive 8 reaches the surface 2a of the insulating layer 2 of the semiconductor device. Under this pressing condition, the connection portion is heated so as to cure the adhesive 8.

Next, the insulating layer 2 made of SiO$_2$ is removed in accordance with etching. At this time, the Si substrate 3 is removed simultaneously. Thus, it is possible to obtain a semiconductor package in which only the circuit constituting section 1 as shown in FIG. 5(b) is connected to the circuit substrate 5 in accordance with the flip chip bonding.

Note that, in performing the etching with respect to the SiO$_2$, hydrofluoric acid is used.

In this manner, the semiconductor package has such a shape that only the circuit constituting section 1 of a thin semiconductor device is packaged on the circuit substrate 5 in accordance with the flip chip packaging, so that it is possible to realize a flexible semiconductor package which can be bent in use.

[Embodiment 3]

Another embodiment of the present invention is described as follows. Note that, the same reference signs are given to members having the same functions as the members of the foregoing embodiment, and description thereof is omitted.

A semiconductor device according to the present embodiment is manufactured as in the embodiment 1. However, the semiconductor device according to the present embodiment is different from the semiconductor device of the embodiment 1 in that, as shown in FIG. 6(a), a solder bump 24 is provided on the circuit constituting section 1 instead of the protruding electrode 4, and in that an adhesive 9 made of thermally-curable resin in liquid form is used instead of the adhesive 7 made of ACF.

The solder bump 24 is provided on the circuit constituting section 1 in accordance with electrolysis plating, and its height is set to be approximately 80 $\mu$m.

Figure 6:
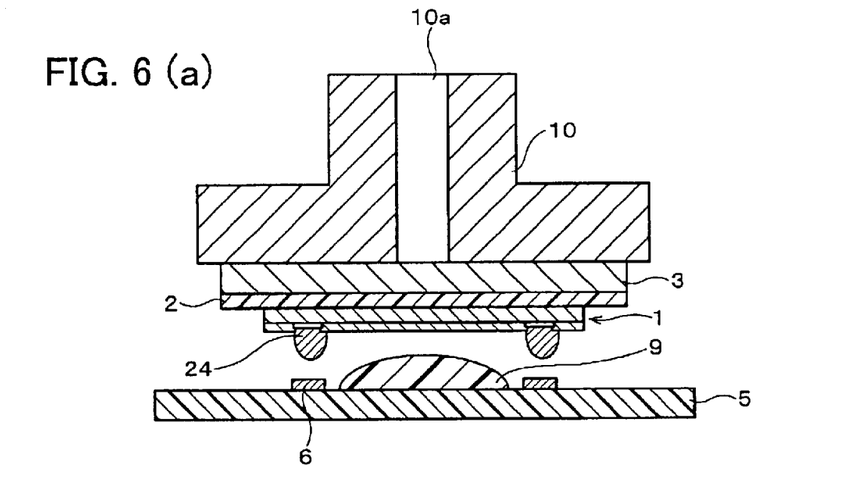
FIG. 6(a) is a schematic sectional view showing a packaging process in which a semiconductor device according to still another embodiment of the present invention is packaged on the circuit substrate.
FIG. 6(b) is a schematic sectional view showing a packaging process in which the semiconductor device according to still another embodiment of the present invention is packaged on the circuit substrate.
FIG. 6(c) is a schematic sectional view showing a packaging process in which the semiconductor device according to still another embodiment of the present invention is packaged on the circuit substrate.

Here, referring to FIGS. 6(a) and 6(b), description is given on a manufacturing process of a semiconductor package in which the semiconductor device arranged in the foregoing manner is packaged on the circuit substrate 5.

First, as shown in FIG. 6(a), the adhesive 9 is provided on a predetermined position on the circuit substrate 5, that is, a position in the vicinity of a central portion of the connection portion between the circuit constituting section 1 and the circuit substrate 5.

While, the semiconductor device is subjected to absorption by means of the bonding collet 10, and the solder bump 24 of the semiconductor device is placed so as to correspond to the electrode 6 of the circuit substrate 5.

Further, when the bonding collet 10 adds a pressure so that the semiconductor device and the circuit substrate 5 are in contact with each other, the adhesive 9 spreads between the semiconductor device and the circuit substrate 5 as shown in FIG. 6(b), and a part of the adhesive 9 is let out, so that an overflowing portion 9a of the adhesive 9 reaches the surface 2a of the insulating layer 2 of the semiconductor device.

Under this pressing condition, the circuit substrate 5 is put into a reflow oven so that the solder bump 24 melts so as to spread to the electrode 6 of the circuit substrate 5. At this time, the adhesive 9 is cured by the heat.

Next, the insulating layer 2 made of SiO$_2$ is removed in accordance with etching. At this time, the Si substrate 3 is removed simultaneously. Thus, it is possible to obtain a semiconductor package in which only the circuit constituting section 1 as shown in FIG. 6(c) is connected to the circuit substrate 5 in accordance with the flip chip bonding.

Note that, in performing the etching with respect to the SiO$_2$, hydrofluoric acid is used.

In this manner, the semiconductor package has such a shape that only the circuit constituting section 1 of a thin semiconductor device is packaged on the circuit substrate 5 in accordance with the flip chip packaging, so that it is possible to realize a flexible semiconductor package which can be bent in use.

As described above, according to the present invention, since it is possible to package a semiconductor device so that an extremely thin semiconductor circuit constituting section is reinforced with the Si substrate, it is possible to treat a semiconductor chip without damaging the semiconductor chip.

Further, it is possible to realize flip chip packaging performed by using the adhesive such as ACF and ACP which softens and flows upon connection, so that it is possible to provide a flexible semiconductor package which can be bent.

An area of the insulating layer of the semiconductor device is set so that the adhesive used upon connecting the circuit constituting section via the drawing electrode to the circuit substrate in accordance with the flip chip bonding does not overflows from the insulating layer after overflowing from the connection portion between the circuit constituting section and the circuit substrate.

In this case, it is possible to dam the adhesive, which had overflowed from a space between the semiconductor device and the circuit substrate, by means of the insulating layer without fail, so that the adhesive does not reach a rear surface of the semiconductor device, that is, a face with which the bonding collet etc. is in contact.

Thus, the adhesive which had overflowed does not adhere to members such as the bonding collet which are required in the flip chip bonding, so that it is possible to obtain such an effect that the productivity of the semiconductor package can be improved.

Further, the insulating layer may be provided on a silicon substrate whose area is as large as that of the insulating layer.

In this case, the insulating layer is provided on a silicon substrate whose area is as large as that of the insulating layer, so that the insulating layer is subjected to the flip chip bonding with it having the silicon substrate. Thus, even in a case where the circuit constituting section is so thin as to tend to be damaged, the silicon substrate functions as a reinforcing substrate, so that it is possible to provide such a semiconductor device that: the strength of the semiconductor device can be secured so as to prevent it from being damaged, and it is easy to treat the semiconductor device with ease.

The externally-drawing electrode may be a protruding electrode which protrudes toward the circuit substrate in a case where the externally-drawing electrode is made of any one of nickel, gold, and solder, and the circuit constituting section is opposite to the circuit substrate.

In this case, the protruding electrode is formed on a surface of the circuit constituting section of the semiconductor device, so that it becomes possible to perform the flip chip bonding easily and without fail. Further, the electrode is made of any one of nickel, gold, and solder, so that it is possible to obtain suitable conductivity after performing the flip chip bonding.

A thickness of the circuit constituting section may be 0.5 $\mu$m to 100 $\mu$m.

In this case, the thickness of the semiconductor layer having the circuit constituting section is set to 0.5 $\mu$m to 100 $\mu$m, so that the semiconductor device has the strength with respect to bending so as to have the flexibility. Thus, it is possible to provide a thin semiconductor package which can be bent.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device comprising:

a circuit constituting section having a function circuit and an externally-drawing electrode, connected to the function circuit, on a surface of the circuit constituting section; and an insulating layer provided on a side of a rear surface of the circuit constituting section, wherein the insulating layer has a face opposite to the circuit constituting section, and an area of the face is set so as to be larger than an area of the rear surface of the circuit constituting section, and said semiconductor device further includes a silicon substrate, said insulating layer being provided on the silicon substrate.

2. The semiconductor device as set forth in claim 1, wherein in the insulating layer, the area of the face opposite to the circuit constituting section is set so that an adhesive, used upon connecting the circuit constituting section via the externally-drawing electrode to a circuit substrate in accordance with flip chip bonding, does not overflow from the insulating layer after overflowing from a connection portion between the circuit constituting section and the circuit substrate.

3. The semiconductor device as set forth in claim 1, wherein the externally-drawing electrode is made of any one of nickel, gold, and solder, and the externally-drawing electrode is a protruding electrode that protrudes toward the silicon substrate when the circuit constituting section is opposite to the silicon substrate.

4. The semiconductor device as set forth in claim 1, wherein a thickness of the circuit constituting section is 0.5 $\mu$m to 100 $\mu$m.

5. A package semiconductor device comprising:

the semiconductor device including: a circuit constituting section having a function circuit and an externally-drawing electrode, connected to the function circuit, on a first surface of the circuit constituting section; and an insulating layer provided on a second surface of the circuit constituting section, wherein: the insulating layer has a face opposite to the circuit constituting section, and an area of the face is set so as to be larger than an area of the rear surface of the circuit constituting section, the insulating layer being provided on a silicon substrate.

6. The semiconductor device as set forth in clam 4, wherein the thickness of the circuit constituting section is 0.5 $\mu$m to 10 $\mu$m.

7. The semiconductor device as set forth in claim 6, wherein the thickness of the circuit constituting section is 3 $\mu$m.

8. The semiconductor device as set forth in claim 1, wherein the insulating layer is as large as an area of the silicon substrate.

* * * * *